(12) United States Patent
Mimura (10) Patent No.: US 7,967,147 B2
(45) Date of Patent: Jun. 28, 2011

(54) SUBSTRATE STORAGE CONTAINER (75) Inventor: Hiroshi Mimura, Itoigawa (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 96 days.

(21) Appl. No.: 12/513,304

(22) PCT Filed: Oct. 26, 2007

(86) PCT No.: PCT/JP2007/070929
§ 371 (c)(1),
(2), (4) Date: May 1, 2009

(87) PCT Pub. No.: WO2008/056549
PCT Pub. Date: May 15, 2008

(65) Prior Publication Data
US 2010/0072107 A1    Mar. 25, 2010

(30) Foreign Application Priority Data

Nov. 7, 2006   (JP) .................................. 2006-301270
Nov. 27, 2006  (JP) .................................. 2006-318318

(51) Int. Cl.
   *B65D 85/48*   (2006.01)
(52) U.S. Cl. ............................ 206/711; 206/454; 414/217
(58) Field of Classification Search .................. 206/710, 206/711, 454, 832, 587, 448; 211/41.12; 414/937, 217, 217.1
See application file for complete search history.

(56) References Cited

U.S. PATENT DOCUMENTS

| | | | | |
|---|---|---|---|---|
| 4,043,451 A | * | 8/1977 | Johnson | 206/711 |
| 4,555,024 A | * | 11/1985 | Voss et al. | 206/454 |
| 4,721,207 A | * | 1/1988 | Kikuchi | 206/307 |
| 5,228,568 A | * | 7/1993 | Ogino et al. | 206/711 |
| 5,253,755 A | * | 10/1993 | Maenke | 206/308.3 |
| 5,273,159 A | * | 12/1993 | Gregerson | 206/711 |
| 5,555,981 A | * | 9/1996 | Gregerson | 206/711 |
| 5,749,467 A | * | 5/1998 | Gregerson | 206/445 |

(Continued)

FOREIGN PATENT DOCUMENTS

| | | |
|---|---|---|
| JP | 1-139434 U | 9/1989 |
| JP | 7-66939 | 7/1995 |
| JP | 2000-281171 | 10/2000 |
| JP | 2003-258079 | 9/2003 |

(Continued)

OTHER PUBLICATIONS

International Search Report w/translation from PCT/JP2007/070929 dated Nov. 20, 2007 (4 pages).

(Continued)

*Primary Examiner* — David T Fidei
(74) *Attorney, Agent, or Firm* — Osha • Liang LLP (57) ABSTRACT

A substrate storage container includes a container body capable of storing a plurality of substrates in array, a lidding body, and a retainer for retaining substrates therebetween. The retainer includes a plurality of flexible and elastic pieces that are extended from the interior side of the lidding body in the direction of substrates stored in the container body and arranged in the direction of the array of the plurality of substrates, and holding groove pieces each formed with the elastic piece for touching and holding the rim of the substrate. The elastic piece with holding groove piece is gradually curved outwardly with respect to the width direction of the substrate from the interior side of the lidding body toward the substrate, so as to reduce the contact-holding area of the holding groove piece with the rim of the substrate.

19 Claims, 7 Drawing Sheets

U.S. PATENT DOCUMENTS

| | | | |
|---|---|---|---|
| 6,082,540 A * | 7/2000 | Krampotich et al. | 206/445 |
| 6,591,987 B2 * | 7/2003 | Wu et al. | 206/454 |
| 6,644,477 B2 * | 11/2003 | Bores et al. | 206/711 |
| 7,523,830 B2 * | 4/2009 | Burns et al. | 206/711 |
| 2003/0132133 A1 * | 7/2003 | Cheesman et al. | 206/454 |
| 2003/0221985 A1 * | 12/2003 | Yajima et al. | 206/454 |
| 2006/0027477 A1 * | 2/2006 | Matsutori et al. | 206/454 |
| 2006/0042998 A1 * | 3/2006 | Haggard et al. | 206/711 |
| 2007/0295638 A1 * | 12/2007 | Nakatogawa | 206/711 |

FOREIGN PATENT DOCUMENTS

| | | |
|---|---|---|
| JP | 2005-005396 A | 1/2005 |
| JP | 2005-005525 A | 1/2005 |

OTHER PUBLICATIONS

Patent Abstracts of Japan for Japanese patent application with Publication No. 03-114245, Publication Date: May 15, 1991, 1 page.

Patent Abstracts of Japan for Japanese patent application with Publication No. 2000-281171, Publication Date: Oct. 10, 2000, 1 page.

Patent Abstracts of Japan for Japanese patent application with Publication No. 2003-258079, Publication Date: Sep. 12, 2003, 1 page.

PCT International Preliminary Report on Patentability and English Translation of PCT Written Opinion of the International Searching Authority, 7 pages.

* cited by examiner

(Prior Art)

SUBSTRATE STORAGE CONTAINER

TECHNICAL FIELD

The present invention relates to a substrate storage container for storing semiconductor wafers or glass masks for processing, conveyance, transportation and the like.

BACKGROUND ART

Figure 14:
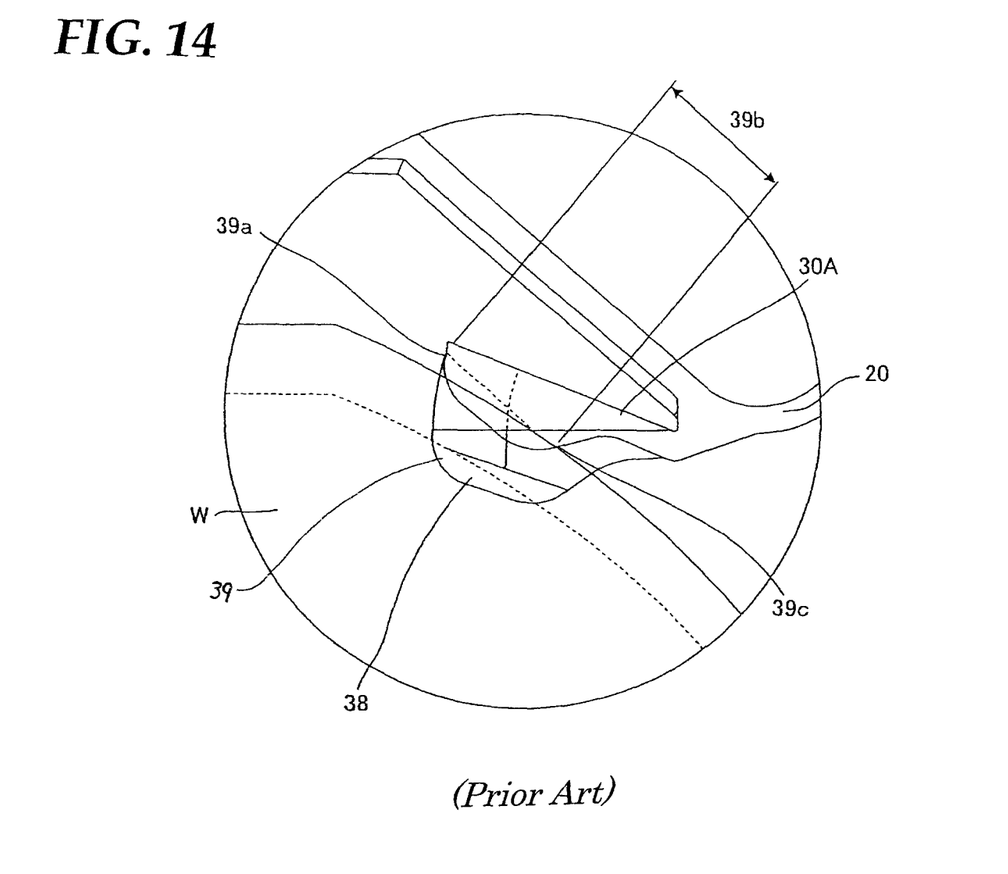
[FIG. 14] is a partially enlarged illustrative view showing the relationship between a lidding body, semiconductor wafer and retainer in a conventional substrate storage container.

As partially shown in FIG. 14, a conventional substrate storage container for storing thin round semiconductor wafers W is constructed of a container body for storing a plurality of vertically standing semiconductor wafers W in array and a lidding body 20 detachably fitted to the open top of this container body to cover and protect the upper part of the plural semiconductor wafers W. This lidding body 20 has a retainer 30A for retaining semiconductor wafers W formed in the upper interior surface thereof. This retainer 30A effectively protects brittle semiconductor wafers W from contamination, damage etc. (see patent documents 1, 2, 3 and 4).

As shown in FIG. 14, retainer 30A includes a plurality of flexible, elastic holding pieces 38 that are extended on the interior surface of lidding body 20 linearly and horizontally along the upper part of the rims of semiconductor wafers W stored in the container body and arranged in the direction of the array of multiple semiconductor wafers W, and functions to make a holding groove 39, depressed at the front end of each elastic holding piece 38, be contact with and hold the rim of semiconductor wafer W so that semiconductor wafers W will be prevented from wobbling and rubbing one another during conveyance and transportation of the substrate storage container and thus these 38 and 39 will keep the wafers clean by suppressing generation of particles accompanied by wobbling and rubbing.

In this retainer 30A, as lidding body 20 is fitted to and pressed against the open top of the container body, elastic holding piece 38 touches the upper end of the rim of each semiconductor wafer W and gradually becomes flexed upward so as to hold each semiconductor wafer W by acting retaining force on it. During this, elastic holding piece 38 partially touches front end 39a of holding groove 39 at the start of contact with the upper part of the rim of semiconductor wafer W and touches whole area 39b of holding groove 39 as it becomes flexed upward and touches terminal end 39c on the proximal side of holding groove 39 at the final stage of contact.

Patent document 1:
 Japanese Patent Publication Hei 07 No. 66939
Patent document 2:
 Japanese Patent Application Laid-open No. 2005-5396
Patent document 3:
 Japanese Patent Application Laid-open No. 2000-281171
Patent document 4:
 Japanese Patent Application Laid-open No. 2003-258079

DISCLOSURE OF INVENTION

Problems to be Solved by the Invention

Since, in the conventional substrate storage container, when elastic holding piece 38 comes into contact with the upper end of the rim of semiconductor wafer W, front end 39a of holding groove 39 of elastic holding piece 38 starts contact, the whole area 39b of holding groove 39 touches as it become flexed upward, and then terminal end 39c on the proximal side of holding groove 39 touches at the final stage of contact, the whole area 39b of holding groove 39 comes in contact with the rim of semiconductor wafer W as it relatively moves from front end 39a to terminal end 39c so that the wafer is abraded not a little. Accordingly, there is a fear of producing contamination of semiconductor wafers W every time lidding body 20 is set.

Further, since in the conventional substrate storage container, a plurality of elastic holding pieces 38 are merely arranged on the ceiling of lidding body 20 and the back side of each elastic holding piece 38 and holding groove 39 that is not in contact with semiconductor wafer W is formed angularly with approximately right angles, when elastic holding piece 38 of retainer 30A holds semiconductor wafer W by holding groove 39, the elastic holding piece 38 may be flexed obliquely upward, causing itself to fit to and interfere with adjacent other elastic holding piece 38.

As a result of this interference, there occurs the problem that the flexed elastic holding piece 38 remains interfering with the adjacent elastic holding piece 38 and will not return to the original position when lidding body 20 is removed from the container body or that retention of semiconductor wafers W is hindered so that semiconductor wafers W are wobbled, rubbed against one another and damaged and contaminated. This problem occurs conspicuously when few semiconductor wafers W are stored so that elastic holding piece 38 holding semiconductor wafer W and elastic holding piece 38 without holding any semiconductor wafer W exist side by side.

The present invention has been devised in view of the above, it is therefore an object to provide a substrate storage container which can reduce substrate contamination by reducing contact area of its retainer with the substrates. The invention also provides a substrate storage container which can suppress interference of a flexed elastic piece with another elastic piece, hence prevent the substrates from wobbling, rubbing each other and being damaged and contaminated.

Means for Solving the Problems

In order to solve the above problem, the present invention resides in a substrate storage container comprising: a container body capable of storing a plurality of substrates in array, a lidding body and a retainer for retaining substrates therebetween, and is characterized in that the retainer includes a plurality of flexible, elastic pieces that are extended from the interior side of the lidding body in the direction of substrates being stored in the container body and arranged in the direction of the array of a plurality of substrates, and holding groove pieces each formed with the elastic piece for touching and holding the rim of the substrate, and the elastic piece with holding groove piece is gradually curved outward with respect to the width direction of the substrate as it goes from the interior side of the lidding body toward the substrate, so as to reduce the contact-holding area of the holding groove piece with the rim of the substrate.

Here, it is possible to construct such that the container body is formed in an approximately box-like configuration having an open top so that a cassette, at least, having a top opening is detachably fitted therein and the cassette is formed so as to have arrayed supporting grooves for substrates arranged on interior surface of both side walls thereof.

Further, it is possible to construct such that a pair of elastic pieces approximately opposing the rim of the substrate are provided, a plurality of the paired elastic pieces are arrayed in the direction of the array of multiple substrates so that each elastic piece is projected from the interior surface of the lidding body, forming a holding groove piece at the front end thereof, and the elastic piece with the holding groove piece is curved in an approximately semi-circular shape and directed outward with respect to the width direction of the substrate.

Further, it is also possible to construct such that the retainer includes an interference avoiding facet, at least formed in either the elastic piece or the holding groove piece so that the interference avoiding facets avoid interference between adjacent multiple elastic pieces and/or between holding groove pieces.

It is possible to construct such that, of the two opposing surfaces of the elastic piece that oppose other elastic pieces, one of the opposing surfaces is formed with a depressed portion while the other opposing surface is formed with a projected portion, and the depressed portion and projected portion are, at least, partially inclined forming interference avoiding facets, so that a plurality of adjacent elastic pieces are positioned using the depressed portions and projected portions.

It is possible to construct such that, of the two opposing surfaces of the holding groove piece that oppose other holding groove pieces, one of the opposing surfaces is formed with a depressed portion while the other opposing surface is formed with a projected portion, and the depressed portion and projected portion are, at least, partially inclined forming interference avoiding facets, so that a plurality of adjacent holding groove pieces are positioned using the depressed portions and projected portions.

Also, it is preferable that the interference avoiding facet is inclined with an obtuse angle of 110° to 175°.

It is also preferable that the interference avoiding facet is inclined with an obtuse angle of 135° to 160°.

It is preferred that the container body is formed in an approximately box-like configuration having an open front with arrayed supporting grooves for substrates arranged on the interior surface of both side walls thereof, and a pair of elastic pieces approximately opposing the rim of the substrate are provided, a plurality of the paired elastic pieces are arrayed in the direction of the array of multiple substrates and attached to an attachment plate while the attachment plate is provided on the interior surface of the lidding body, each elastic piece having a holding groove piece formed at the front end thereof.

Here, the substrates defined in the scope of the claims may at least include a single or plurality of semiconductor wafers (types of 150 mm, 200 mm, 300 mm and 450 mm in diameter), liquid crystal substrates, glass substrates, compound wafers, carbon wafers, glass masks and the like. The container body may be a type that directly stores a plurality of substrate in array or a type that stores them in array using a cassette.

The lidding body and the retainer may be integrally formed or detachably formed as separate parts. It is preferable that the contact point between the rim of the substrate and the holding groove piece is of a point contact or a line contact and substantially unvaried. As to the contact point between the rim of the substrate and the holding groove piece, the contact point on the substrate will be little moved from the contact point at the beginning even if the elastic piece is flexed and displaced as the lidding body is fitted to the container body. On the other hand, though the contact point on the holding groove piece side moves to the final contact point as the holding groove piece is displaced, the range of movement of this contact point preferably falls with the range of ±1.5 mm from the initial contact point.

The holding groove piece may preferably have a hollow guide groove portion formed at the front end of the elastic piece and a grooved bottom portion formed of a recess in this guide groove portion for holding the rim of the substrate guided by the slope of the guide groove portion. Further, it is not particularly important whether the interference avoiding facet is formed of an inclined surface, C-surface, R-surface or curved surface as long as it can avoid interference between adjoining multiple elastic pieces and/or between holding grooves.

According to the present invention, in storing substrates in the substrate storage container, when the lidding body is covered over the opening of the container body with substrates stored therein so as to cause the elastic pieces of the retainer to interfere with the rims of the substrates using the holding groove pieces, it is possible to store the substrates by applying the substrates with retaining force obtained as the elastic pieces of the retainer is flexed inwards the lidding body.

At this time, the elastic piece and the holding groove piece are bent so that the front end of the holding groove piece is directed outward with respect to the width direction of the substrate while the contact point on the substrate only moves to an approximately vertical position with little displacement when the elastic piece has been flexed. The displacement of the contact point of the holding groove piece is limited to a slight range up to the contact point when the curvature of the holding groove piece has become small. Since the contact point on the substrate will be little varied in this way, it is possible to suppress the substrate from being contaminated and damaged due to contact as much as possible.

Further, since the holding groove piece comes into tangential contact with the substrate at its approximately middle part because its front end is curved outwards, and touches the substrate within a narrow range between the contact point at the beginning and the closely located contact point in its holding state, it does not touch the substrate over the wide range. Accordingly, it is possible to decrease generation of particles accompanied by contact between substrates and holding groove pieces.

Further, according to the present invention, since, if the flexed elastic piece and adjacent elastic piece interfere with each other, the interference avoiding facets of the elastic pieces avoid contact and interference therebetween, the adjacent elastic pieces and holding groove pieces will hardly interfere with each other even if the substrate storage container is used repeatedly. Accordingly, it is possible to restore the flexed elastic pieces to their original position when lidding body is removed from the container body.

Effect of the Invention

The present invention is effective in reducing the contact area of the retainer with substrates and hence reduce substrate contamination.

Further, when the container body is formed in an approximately box-like configuration having an open top so that a cassette, at least, having a top opening is detachably fitted therein and the cassette is formed so as to have arrayed supporting grooves for substrates arranged on interior surface of both side walls thereof, it is possible to secure cleanness of substrates even if the container body is soiled since the substrates are stored in a double-folded structure.

A pair of elastic pieces approximately opposing the rim of the substrate are provided. A plurality of the paired elastic pieces are arrayed in the direction of the array of multiple substrates so that each elastic piece is projected from the interior surface of the lidding body, forming a holding groove piece at the front end thereof. These elastic pieces and holding groove pieces are curved in an approximately semi-circular shape and directed outward with respect to the width direction of the substrates, so that it is possible to make the holding groove piece touch the rim of the substrate with a slightest area (point contact or line contact), hence direct the direction of movement of the contact point between the substrate and holding groove piece to the directions other than direction of the array of the elastic pieces. Accordingly, it is possible to avoid the part other than the contact portion of the holding groove piece moving towards and touching the neighboring holding groove pieces, hence it is possible to suppress abrasion and contamination of substrates.

Moreover, the present invention has an effect to be able to prevent substrates from wobbling, rubbing, being damaged and contaminated because provision of interference avoiding facets evades interference between adjacent multiple elastic pieces and between holding groove pieces.

Further, when the interference avoiding facet is inclined with an obtuse angle of 110° to 175°, it is possible to prevent a flexed elastic piece from interfering with another adjacent elastic piece and correct the displaced substrate to its regular position.

DESCRIPTION OF REFERENCE NUMERALS 1 cassette
2 side wall
6 teeth
7 arrayed supporting groove
7A arrayed supporting groove
10 container body
10A container body
20 lidding body
20A lidding body
30 retainer
31 elastic piece
32 depressed portion
33 projected portion
34 holding groove piece
35 guide groove portion
36 bottom groove portion
37 interference avoiding facet
40 attachment plate
W semiconductor wafer (substrate)

BEST MODE FOR CARRYING OUT THE INVENTION

Referring next to the drawings, a preferred embodiment of the present invention will be described. A substrate storage container of the present embodiment includes: as shown in FIGS. 1 to 6, a container body 10 for storing a plurality of semiconductor wafers W in array using a cassette 1; a lidding body 20 detachably fitted to the top opening of this container body 10 with a seal gasket interposed therebetween to cover and protect the multiple semiconductor wafers W in an airtight manner; and a retainer 30 interposed between these container body 10 and lidding body 20 for elastically holding each semiconductor wafer W.

Figure 2:
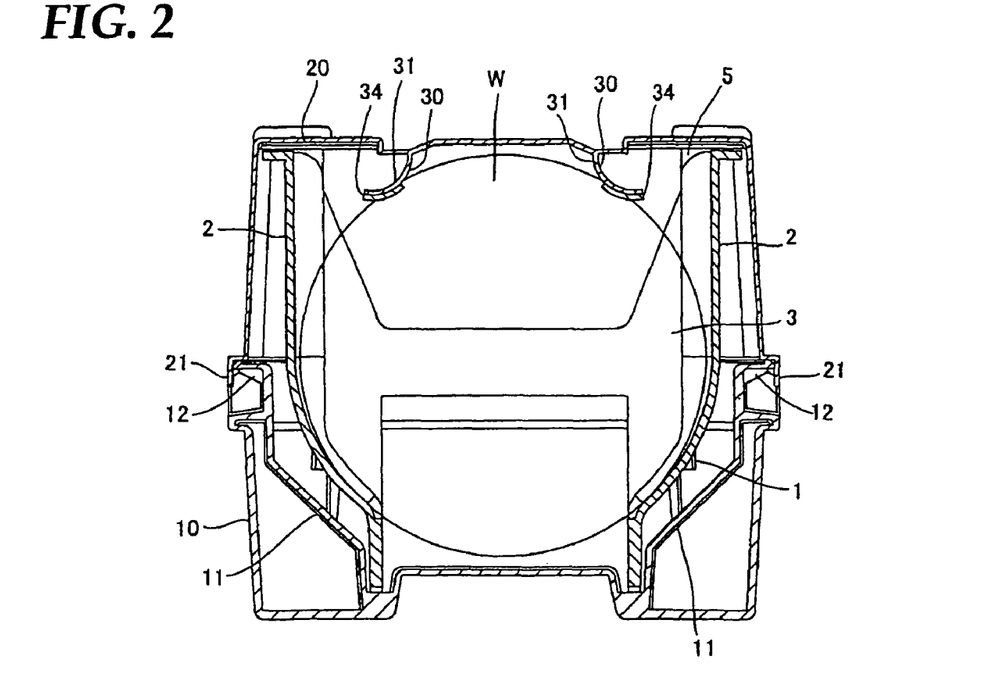
[FIG. 2] is a sectional illustrative view schematically showing the embodiment of a substrate storage container according to the present invention.

The plural semiconductor wafers W, for example, 13, 25 or 26 wafers, are stored in array in cassette 1, and arranged upright in a row from front to back of cassette 1 (in the depth direction in FIG. 2). Each semiconductor W is a thin round sliced type of 150 mm in diameter, for example, with an orientation flat or a notch for positioning selectively formed part of its rim.

Cassette 1, container body 10, lidding body 20 and retainer 30 are formed by injection molding using a molding material of thermoplastic resin such as polypropylene, polyethylene, polycarbonate, cycloolefin polymer, polybutylene terephthalate or the like. Of these molding materials, use of translucent polypropylene or transparent polycarbonate is preferable in view of making semiconductor wafers W visible and graspable.

Figure 1:
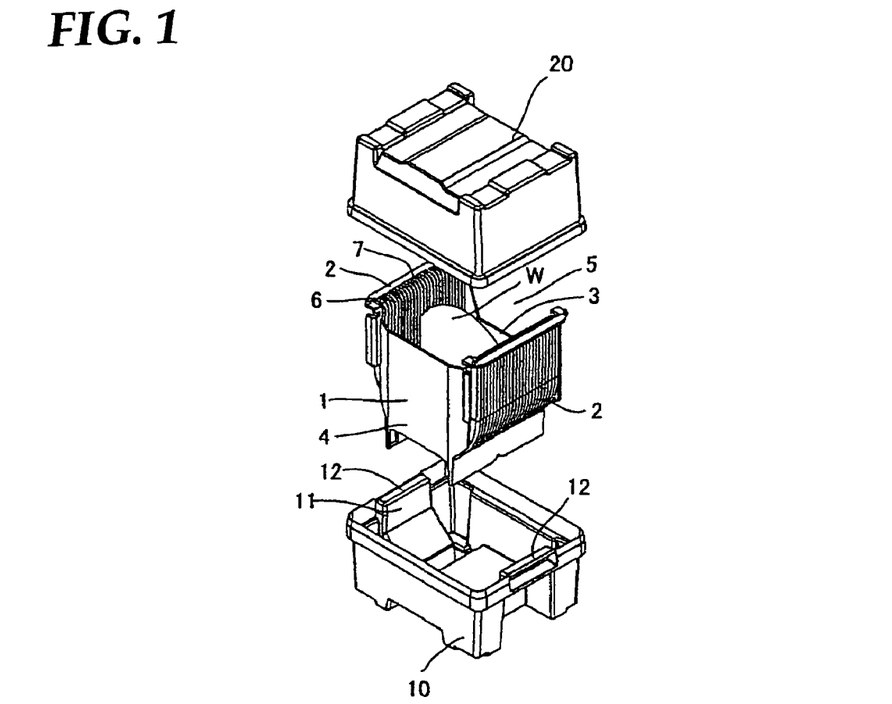
[FIG. 1] is an exposed perspective and illustrative view schematically showing the embodiment of a substrate storage container according to the present invention.

As shown in FIGS. 1 and 2, cassette 1 is formed translucent, including a pair of opposing left and right side walls 2 spaced a distance equal to or greater than the diameter of semiconductor wafer W, a front plate 3 having an approximately H-shape viewed from front, arranged and joined between the front ends of the paired side walls 2 and a backside plate 4 arranged and joined between rear ends of the paired side walls 2, and is detachably fitted into container body 10 from top. This cassette 1 is formed in an approximately cuboid shape with its top and bottom open and its open large top is adapted to be an input/output opening 5 for semiconductor wafers W so as to allow semiconductor wafers W to be pushed up and slid upwards.

Each side wall 2 is bent formed in a sectionally open-V shape, gradually bending inwards from top to bottom with its inner surface formed with a plurality of tapered teeth 6 arranged from front to the rear with a regular pitch like comb teeth, so that gaps between these multiple teeth 6 section and form arrayed supporting grooves 7 that permit insertion of semiconductor wafers W.

As shown in FIGS. 1 and 2, container body 10 has a translucent top-open box configuration having a top opening, and has a pair of opposing portions 11, arranged on both sides in its interior, a clearance apart from, and opposing, the bent lower parts of both side walls 2 of cassette 1, to provide the function of an outer box for exterior. This container body 10 is constructed so that an endless seal gasket for maintaining airtightness can be fitted around the top rim of the opening. This seal gasket is an elastic molding having an approximately frame-like form when viewed from top, using silicone rubber, fluororubber, or polyester, polyethylene or other thermoplastic elastomer, for example. Further, a depressed engagement groove 12 for lidding body 20 is formed at the top of either side wall of container body 10.

Figure 3:
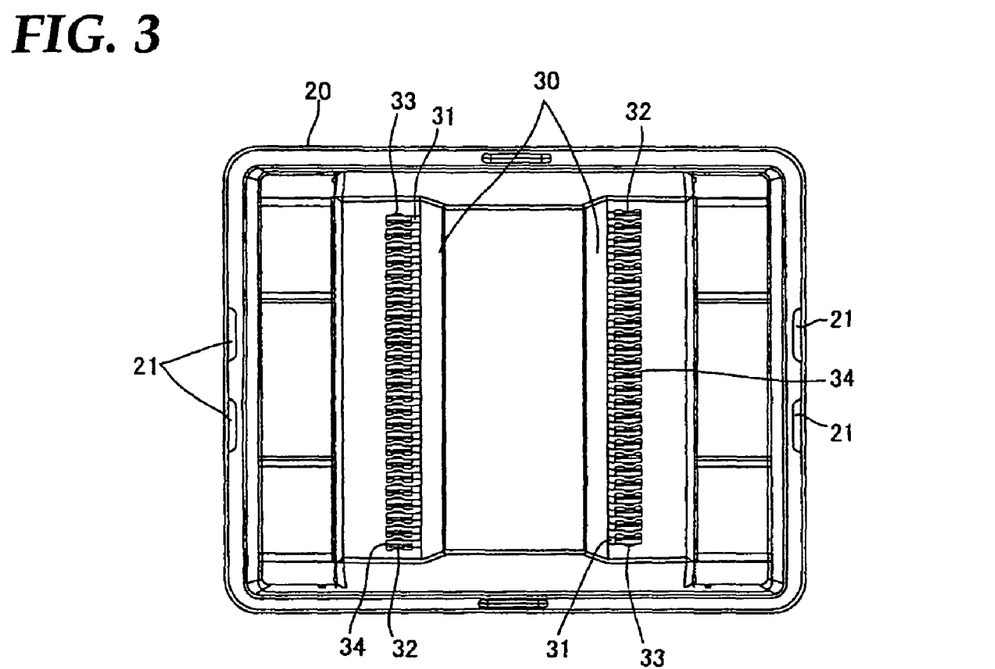
[FIG. 3] is an illustrative view schematically showing the interior side and a retainer of a lidding body in the embodiment of a substrate storage container according to the present invention.

As shown in FIGS. 1 through 3, lidding body 20 has a hollow translucent, sectionally approximately hat-like or sectionally approximately inverted U-shaped configuration and is integrally formed with a flexible engagement piece 21 that is formed on either side to engage engagement groove 12 of container body 10, to provide the function of covering and protecting cassette 1 and approximately the upper half of multiple semiconductor wafers W.

As shown in FIGS. 2 to 6, retainer 30 is integrally formed around the central part of the upper interior surface of lidding body 20 and includes: a plurality of flexible elastic pieces 31 that are arranged in the direction of the array of multiple semiconductor wafers W and extended toward semiconductor wafers W in container body 10 from the upper interior surface of lidding body 20; holding groove pieces 34 formed in each elastic piece 31 to hold the upper end of the rim of semiconductor wafers W; and a plurality of interference avoiding facets 37 formed on each elastic piece 31 and holding groove piece 34.

Figure 6:
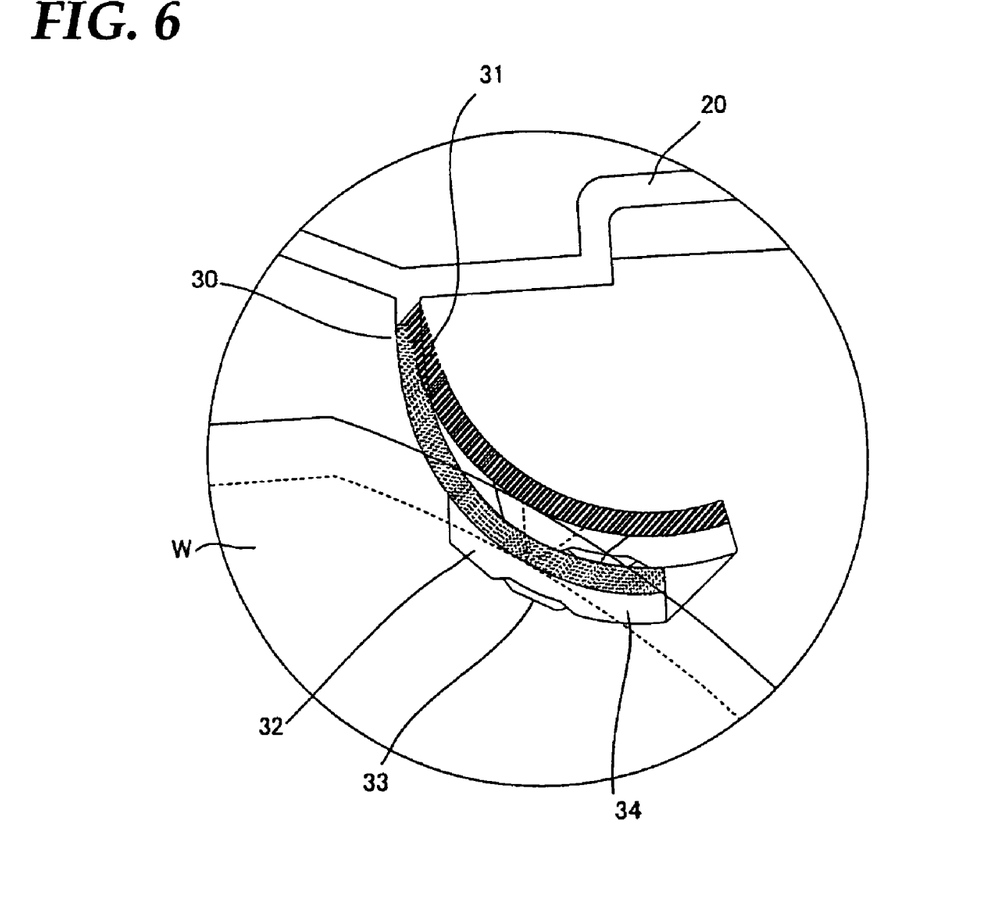
[FIG. 6] is a partially enlarged illustrative view schematically showing a semiconductor wafer, elastic piece and holding groove piece in the embodiment of a substrate storage container of the present invention.

As shown in FIGS. 2, 3 and 6, plural elastic pieces 31 are formed so that a pair of left and right elastic pieces 31 are disposed apart from each other so as to extend along the upper part of the rim of semiconductor wafer W like the shape of a Chinese numeral 8 (two lines widen downward) and plural pairs of elastic pieces 31 are arranged with a predetermined pitch in the direction of the array of plural semiconductor wafers W. Each elastic piece 31 is formed of, for example, an elongate elastic strip integrally formed on the upper interior surface of lidding body 20 with a holding groove piece 34 integrally formed on the surface of the front end of the elastic piece that forms a free end having greater flexibility. The integrated structure of elastic piece 31 and holding groove piece 34 becomes gradually curved in an approximately semi-circular shape so that the front end of holding groove piece 34 id directed outwardly of the radius of semiconductor wafer W.

Of the two opposing surfaces of elastic piece 31 that oppose other holding groove pieces 34, one opposing surface on the holding groove piece 34 side is formed with a depressed portion 32 having a guiding function while the other opposing surface on the holding groove piece 34 side is formed with a projected portion 33 close to depressed portion 32. These depressed portions 32 and projected portions 33 are arranged alternately opposing each other to provide the function of positioning adjacent multiple elastic pieces 31 and holding groove pieced 34 so that the upper ends of the rims of semiconductor wafers W can be appropriately fitted to and retained by holding groove pieces 34.

Figure 4:
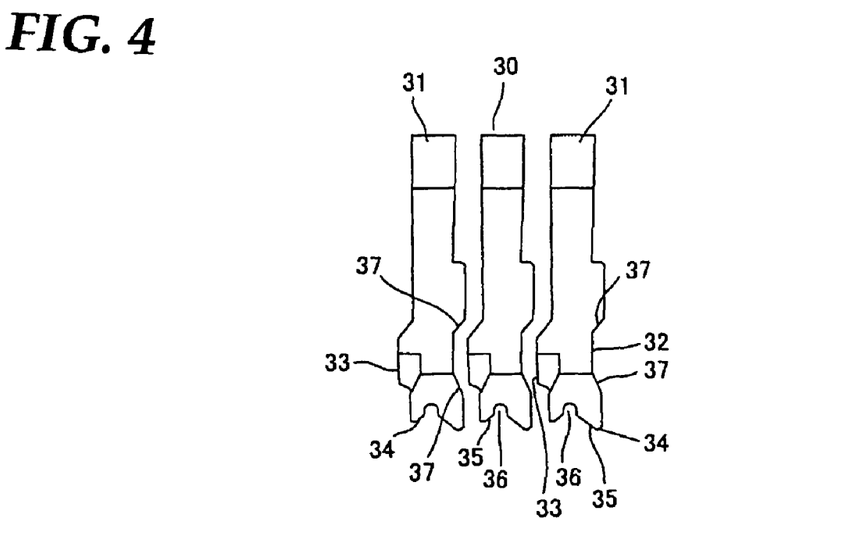
[FIG. 4] is a illustrative side view schematically showing a plurality of elastic pieces and holding groove pieces in the embodiment of a substrate storage container according to the present invention.
Figure 5:
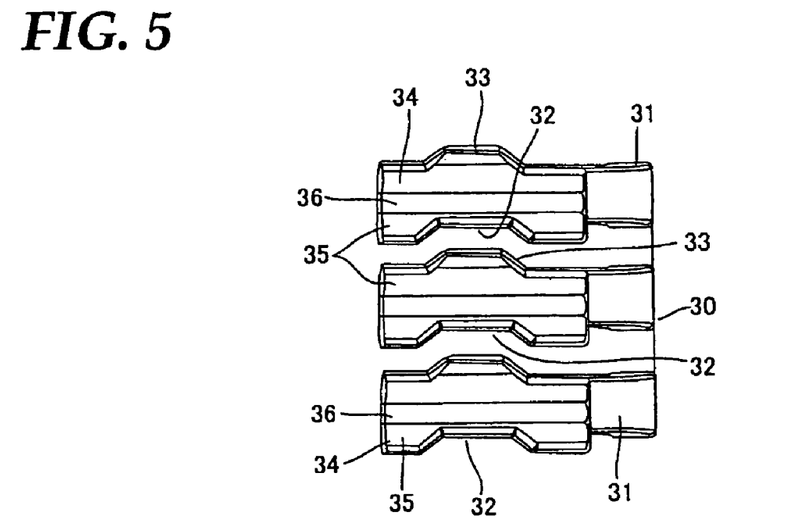
[FIG. 5] is an illustrative surface view schematically showing a plurality of elastic pieces and holding groove pieces in the embodiment of a substrate storage container according to the present invention.

As shown in FIGS. 4 and 5, each holding groove piece 34 includes a guide groove portion 35 having an approximately U-shaped section, approximately V-shape section, or approximately inverted open-V shaped section and a grooved bottom portion 36 having an approximately semicircular section for fitting and holding therein the upper part of the rim of semiconductor wafer W that is guided by the slope of guide groove portion 35, and provides the function of constantly keeping the contact point with the rim of semiconductor wafer W nearly constant.

Interference avoiding facets 37 are formed by cutting out the corners of depressed portion 32 and projected portion 33 obliquely in the thickness direction from each elastic piece 31 to holding groove piece 34, so as to avoid interference between adjacent plural elastic pieces 31 and between holding groove pieces 34. This interference avoiding facet 37 is formed with an obtuse angle of 110° to 175° or preferably 135° to 160°. Other than the corners of depressed portion 32 and projected portion 33, the facets may be formed as appropriate around them.

The reason why the angle of inclination of interference avoiding facet 37 is specified within the range of 110° to 175° is that there is a fear that if it is less than 110°, flexed elastic piece 31 cannot be prevented from fitting into, and interfering with, adjacent elastic piece 31. Conversely, if it exceeds 175°, the position of semiconductor wafer W if it is displaced cannot be reliably corrected. When the angle of inclination of interference avoiding facet 37 falls within a preferable range of 135° to 160°, even if flexed elastic piece 31 fits into adjacent elastic piece 31 the elastic piece 31 will slide to avoid fitting so that the displaced position of semiconductor wafer W can be positively corrected.

In the above, when semiconductor wafers W are stored into the substrate storage container in a properly manner, lidding body 20 is fitted over container body 10 with semiconductor wafers W stored therein from top and pressed down so that elastic piece 31 of retainer 30 is fitted by use of holding groove piece 34 into the top end of the rim of each semiconductor wafer W, then elastic pieces 31 of this retainer 30 flex toward the upper interior surface of lidding body 20 while acting retaining force on each semiconductor wafer W from top so as to position and store them properly.

The retaining force acting on each semiconductor wafer W can be obtained as a reaction when each elastic piece 31 with holding groove piece 34 is raised and flexed by semiconductor wafer W. At this time, the contact point between semiconductor wafer W and holding groove piece 34 also varies. Next, this variation of the contact point will be described in detail with reference to FIG. 6.

Though in reality the position of retainer 30 of lidding body 20 moves approaching semiconductor wafer W while the position of semiconductor wafer W remains unvaried, for description simplicity FIG. 6 illustrates such that the position of retainer 30 of lidding body 20 is assumed to be fixed while the position of semiconductor wafer W when it initially contacts with retainer 30 and the position when it approaches to be held do not overlap each other.

To being with, when semiconductor wafer W is retained, instead of being formed linearly each elastic piece 31 and holding groove piece 34 are curved approximately semi-circularly so that the front end and terminal end go away from the rim of semiconductor wafer W and the front end of holding groove piece 34 is directed outwardly of the radius of semiconductor wafer W (see FIG. 6), hence at the initial contact point the upper part of the rim of semiconductor wafer W can be put into point contact with or short-line contact with guide groove portion 35 of holding groove piece 34 and grooved bottom portion 36.

Also, in the state where elastic piece 31 is flexed to retain the semiconductor wafer, the direction of movement of the contact point between semiconductor wafer W and holding groove piece 34 can be kept unvaried to be the upward direction for reducing the radius of curvature or to be the vertically upward direction only. Also, movement of the contact point of holding groove piece 34 can be also limited within such a small range as the tangential contact point of holding groove piece 34 when its radius of curvature is reduced.

That is, even if elastic piece 31 is compressed and flexed in order to hold semiconductor wafer W, the contact point of semiconductor wafer W is unvaried while the contact region of holding groove piece 34 can be limited to a small range of the curved portion that comes into tangential contact with semiconductor wafer W. Specifically, the contact point does not vary continuously in the longitudinal direction of holding groove piece 34 from the front end to the terminal end of holding groove piece 34, but movement of the contact point can be limited to a narrow range of ±1.5 mm, the displacement from the initial contact point to the position of contact of the curved portion after elastic piece 31 is flexed. Accordingly, it is possible to markedly reduce rubbing between semiconductor wafer W and holding groove piece 34.

Thus, since the range of movement of the contact point between the rim of semiconductor wafer W and holding groove piece 34 can be limited to a small range in which the initial contact point is moved ±1.5 mm to the interior side of lidding body 20 and the region of holding groove piece 34 for contact retention of the rim of semiconductor wafer W can be markedly reduced, the whole part of holding groove piece 34 will not come in contact with the rim of semiconductor wafer W while relatively moving and no particle will arise due to abrasion. Accordingly, it is possible to effectively exclude the risk of semiconductor wafers W being contaminating every time lidding body 20 is set.

Further, since, when semiconductor wafers W is stored elastic pieces 31 and holding groove pieces 34 flex upward or in such a direction that the radius of curvature becomes smaller and the other part than the contact portion with holding groove piece 34 can be prevented from moving toward and interfering with adjacent holding groove pieces 34, it is possible to prevent semiconductor wafers W from being rubbed or contaminated.

Though there may occur such a case that elastic pieces 31 and holding groove pieces 34 flex not only in the upward direction but also in the direction of the array resulting in fit into adjacent elastic pieces 31 and holding groove pieces 34, the inclined interference avoiding facets 37 of elastic pieces 31 will avoid contact and fitting, so that there is no fear of adjacent elastic pieces 31 and holding groove pieces 34 interfering with each other if lidding body 20 is repeatedly used. Accordingly, if lidding body 20 is removed from container body 10, it is possible to restore flexed elastic pieces 31 to their original position, whereby it is possible to prevent hindrance to proper retention of semiconductor wafers W and suppress occurrence of abrasion, damage and contamination and the like due to wobbling and/or rotation of semiconductor wafers W.

Further, since interference avoiding facets 37 of each elastic piece 31 avoid touching and fitting, it is no longer necessary to secure a wide pitch between elastic pieces 31 to avoid their fitting and it is hence possible to easily shorten the pitch between elastic pieces 31 with a simple configuration. Also, since retainer 30 is integrally formed on the upper interior surface of lidding body 20, it is greatly expected of reduction in the number of parts and improvement of cleansability.

Figure 7:
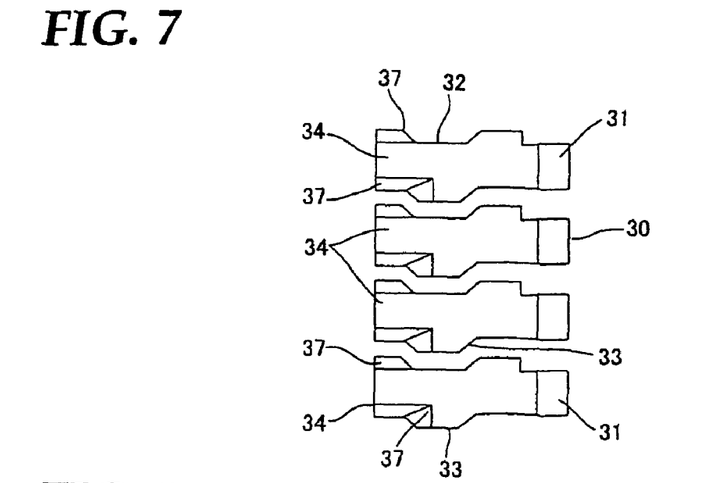
[FIG. 7] is an illustrative view schematically showing the second embodiment of a substrate storage container according to the present invention.

Next, FIG. 7 shows the second embodiment of the present invention. In this case, the opposing surfaces of the elastic piece 31's front end that can flex greatly are formed with C-surfaces without sharp corners instead of inclined surfaces, so as to form multiple interference avoiding facets 37. Other parts are the same as the above embodiment so that description is omitted.

Also in this embodiment, it is apparent that the same operation and effect as that of the above embodiment can be expected and that the configuration of interference avoiding facets 37 can be diversified.

Figure 8:
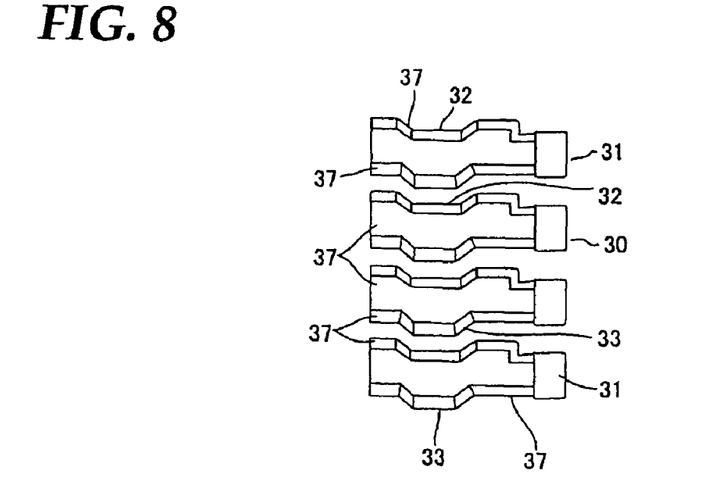
[FIG. 8] is an illustrative view schematically showing the third embodiment of a substrate storage container according to the present invention.

Next, FIG. 8 shows the third embodiment of the present invention. In this case, all the opposing surfaces including the front end part of elastic piece 31 are formed with C-surfaces without sharp corners instead of inclined surfaces, so as to form multiple interference avoiding facets 37.

Figure 9:
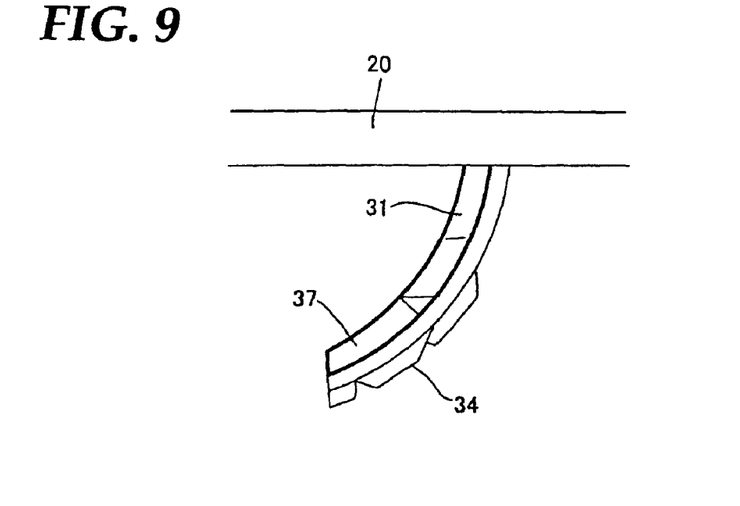
[FIG. 9] is an illustrative view schematically showing a retainer in the third embodiment of a substrate storage container according to the present invention.

Interference avoiding facets 37 may be formed as appropriate in any portion other then the whole opposing surfaces of elastic piece 31 as long as it belong to part of elastic piece 31 indicated by the thick line in FIG. 9. Other parts are the same as the above embodiment so that description is omitted.

Also in this embodiment, it is apparent that the same operation and effect as that of the above embodiment can be expected, and in addition the position and configuration of interference avoiding facet 37 can be diversified.

Figure 10:
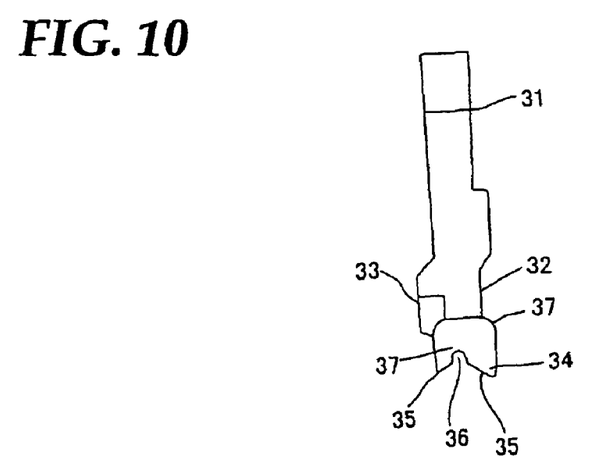
[FIG. 10] is an illustrative view schematically showing the fourth embodiment of a substrate storage container according to the present invention.

Next, FIG. 10 shows the fourth embodiment of the present invention. In this case, the surface of holding groove piece 34 is formed as appropriate with R-surfaces and/or curved surfaces, instead of inclined facets so as to form multiple smooth interference avoiding facets 37. Other parts are the same as the above embodiment so that description is omitted.

Also in this embodiment, it is apparent that the same operation and effect as that of the above embodiment can be expected, and in addition the position and configuration of interference avoiding facet 37 can be expectedly diversified.

Figure 11:
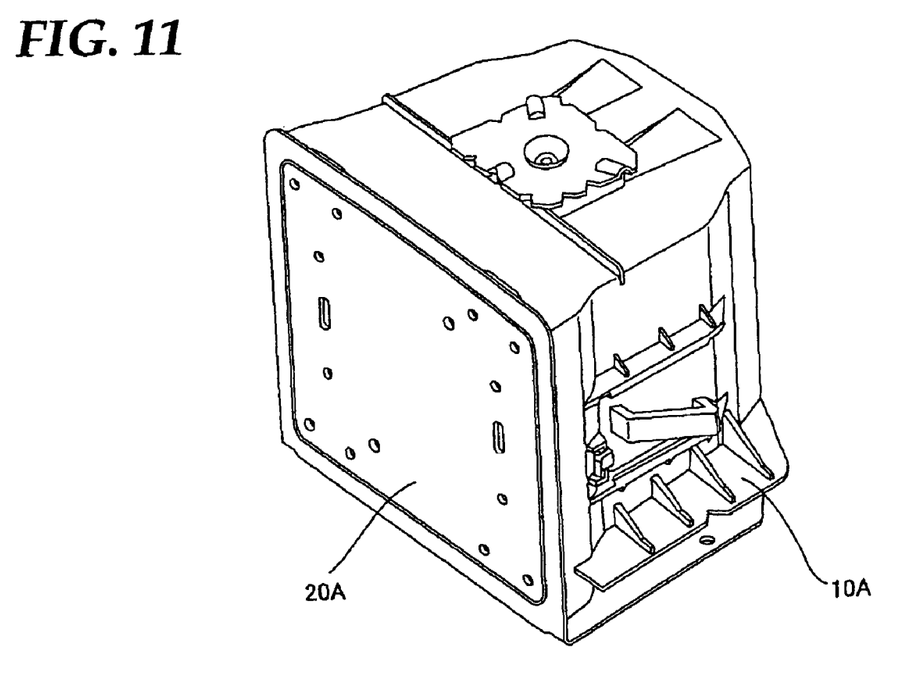
[FIG. 11] is an overall perspective illustrative view schematically showing the fifth embodiment of a substrate storage container according to the present invention.
Figure 12:
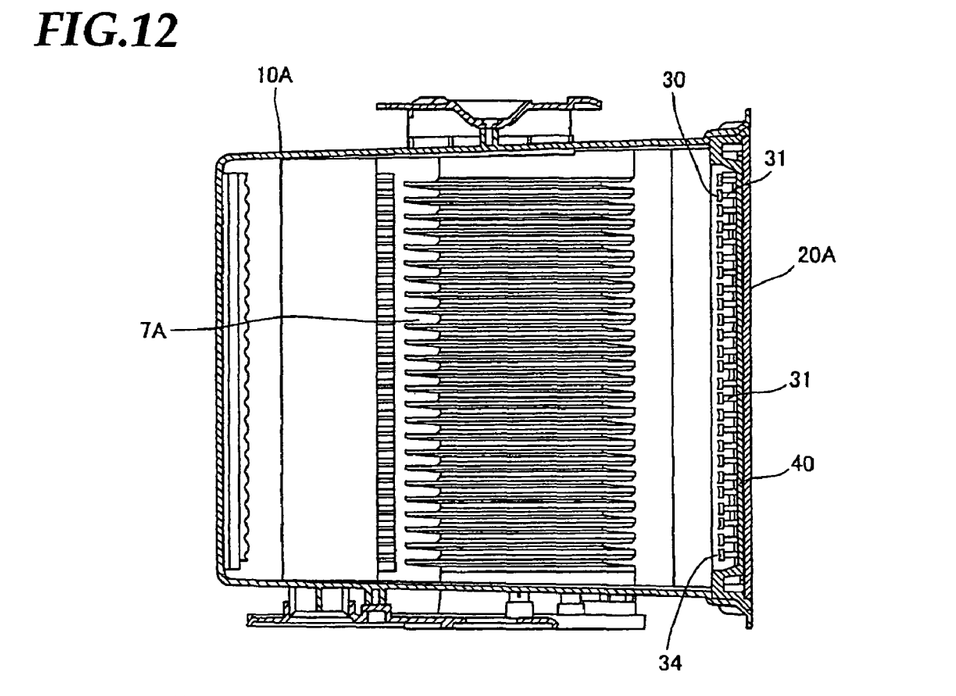
[FIG. 12] is a sectional illustrative view schematically showing the fifth embodiment of a substrate storage container according to the present invention.
Figure 13:
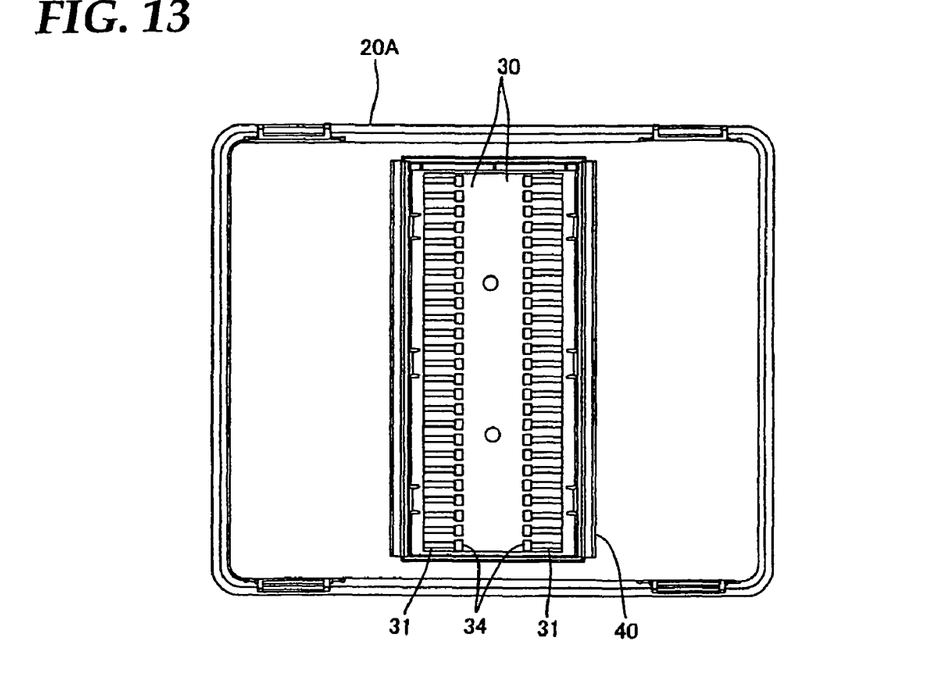
[FIG. 13] is an illustrative view schematically showing a lidding body and retainer in the fifth embodiment of a substrate storage container according to the present invention.

Next, FIGS. 11 to 13 show the fifth embodiment of the present invention. In this case, the substrate storage container or container body 10A is formed to be a front open box having an opening in front while arrayed supporting grooves 7A for semiconductor wafers W of 300 mm in diameter are formed vertically on the interior surface of both side walls. A retainer 30 for opposing and holding the front part of the rims of semiconductor wafers W, having pairs of left and right elastic pieces 31 arranged in the arrayed direction of multiple semiconductor wafers W, or vertically, is integrally formed inside an attachment plate 40. This attachment plate 40 is detachably mounted in the central part on the rear side or the interior surface of a lidding body 20A. Each elastic piece 31 is slightly inclined and projected from the interior surface of lidding body 20A toward the backside of container body 10A while a block-shaped holding groove piece 34 is integrally formed in a swelling manner at the front end of each elastic piece.

Different from lidding body 20, lidding body 20A is formed in a laterally long rectangular shape and incorporates a locking mechanism for locking itself to container body 10A when it is fitted. Attachment plate 40 is formed in a vertically long frame-like shape using a predetermined molding material with a plurality of elastic pieces 31 vertically arrayed inside along both side edges. Other parts are the same as the above embodiment so that description is omitted.

Also in this embodiment, it is apparent that the same operation and effect as that of the above embodiment can be expected, and in addition application of retainer 30 to a front open box type substrate storage container other than the top open box type substrate storage containers can present improved versatility.

Though in the above embodiment, cassette 1 opened at the top and bottom is used so that semiconductor wafers W can taken out by pushing up semiconductor wafers 2 from bottom so as to be suited to automation, the cassette should not be limited to this. A cassette 1 opened at the top only may be used. Also, an endless seal gasket may be fitted along the rim of the lidding body 20. Also, detachable lidding body 20 may be fitted to the opening of container body 10 with an adhesive tape interposed therebetween.

Further, in the above embodiment, depressed portion 32, projected portion 33 and interference avoiding facets 37 are formed from elastic piece 31 to holding groove piece 34, but the arrangement of depressed portion 32, projected portion 33 and interference avoiding facets 37 may be changed as appropriate as long as the same operation and effect as above can be expected. For example, of the two opposing surfaces of each elastic piece 31 that oppose adjacent elastic pieces 31, depressed portion 32 is formed in one of the opposing surface while projected portion 33 is formed in the other opposing surface, and the corners and their vicinity of these depressed portion 32 and projected portion 33 are inclined to be interference avoiding facets 37, so that multiple adjoining elastic pieces 31 and semiconductor wafers W may be positioned using depressed portions 32 and projected portions 33.

Similarly, of the two opposing surfaces of each holding groove piece 34 that oppose adjacent holding groove pieces 34, depressed portion 32 is formed in one of the opposing surface while projected portion 33 is formed in the other opposing surface, and the corners and their vicinity of these depressed portion 32 and projected portion 33 are inclined to be interference avoiding facets 37, so that multiple adjoining holding groove pieces 34 and semiconductor wafers W may be positioned using depressed portions 32 and projected portions 33. The number of depressed portions 32 and projected portions 33 may be appropriately increased as necessary. Further, it is not particularly important whether interference avoiding facet 37 is of an inclined surface, C-surface, R-surface or curved surface. Still more, it is also possible to integrate attachment plate 40 in the central part on the rear side of lidding body 20A.

The invention claimed is:

1. A substrate storage container comprising:
a container body capable of storing a plurality of substrates in array,
a lidding body, and
a retainer for retaining substrates therebetween,
characterized in that the retainer includes
a pair of flexible, elastic pieces that are extended from the interior side of the lidding body in the direction of substrates being stored in the container body and arranged in the direction of the array of a plurality of substrates, and
holding groove pieces each formed with the elastic piece for touching and holding the rim of the substrate,
wherein the elastic piece with holding groove piece is gradually curved outward with respect to the width direction of the substrate from the interior side of the lidding body toward the substrate, so as to reduce the contact-holding area of the holding groove piece with the rim of the substrate; and
wherein the pair of flexible, elastic pieces are, from base to end, extended continuously apart from each other, each of which is convexly curved such that a convex surface of each of the elastic pieces faces the stored substrate.

2. The substrate storage container according to claim 1, wherein the container body is formed in an approximately box-shaped configuration having an open top so that a cassette, at least, having a top opening is detachably fitted therein and the cassette is formed so as to have arrayed supporting grooves for substrates arranged on interior surface of both side walls thereof.

3. The substrate storage container according to claim 1 further comprising:
a pair of elastic pieces approximately opposing the rim of the substrate, and
a plurality of the paired elastic pieces arrayed in the direction of the array of multiple substrates so that each elastic piece is projected from the interior surface of the lidding body, forming a holding groove piece at the front end thereof,
wherein the elastic piece with the holding groove piece is curved in an approximately semi-circular shape and directed outward with respect to the width direction of the substrate.

4. The substrate storage container according to claim 1, wherein the retainer includes an interference avoiding facet, at least formed in either the elastic piece or the holding groove piece so that the interference avoiding facets avoid interference between adjacent multiple elastic pieces and/or between holding groove pieces.

5. The substrate storage container according to claim 1, wherein, of the two opposing surfaces of the elastic piece that oppose other elastic pieces, one of the opposing surfaces is formed with a depressed portion while the other opposing surface is formed with a projected portion, and
the depressed portion and projected portion are, at least, partially inclined forming interference avoiding facets, so that a plurality of adjacent elastic pieces are positioned using the depressed portions and projected portions.

6. The substrate storage container according to claim 1, wherein, of the two opposing surfaces of the holding groove piece that oppose other holding groove pieces, one of the opposing surfaces is formed with a depressed portion while the other opposing surface is formed with a projected portion, and
the depressed portion and projected portion are, at least, partially inclined forming interference avoiding facets, so that a plurality of adjacent holding groove pieces are positioned using the depressed portions and projected portions.

7. The substrate storage container according to claim 4, wherein the interference avoiding facet is inclined with an obtuse angle of 110° to 175°.

8. The substrate storage container according to claim 1, wherein the container body is formed in an approximately box-shaped configuration having an open front with arrayed supporting grooves for substrates arranged on the interior surface of both side walls thereof,
the substrate storage container further comprising:
a pair of elastic pieces approximately opposing the rim of the substrate, and
a plurality of the paired elastic pieces arrayed in the direction of the array of multiple substrates and attached to an attachment plate while the attachment plate is provided on the interior surface of the lidding body, each elastic piece having a holding groove piece formed at the front end thereof.

9. The substrate storage container according to claim 2 further comprising:
a pair of elastic pieces approximately opposing the rim of the substrate, and
a plurality of the paired elastic pieces are arrayed in the direction of the array of multiple substrates so that each elastic piece is projected from the interior surface of the lidding body, forming a holding groove piece at the front end thereof,
wherein the elastic piece with the holding groove piece is curved in an approximately semi-circular shape and directed outward with respect to the width direction of the substrate.

10. The substrate storage container according to claim 2 wherein the retainer includes an interference avoiding facet, at least formed in either the elastic piece or the holding groove piece so that the interference avoiding facets avoid interference between adjacent multiple elastic pieces and/or between holding groove pieces.

11. The substrate storage container according to claim 3 wherein the retainer includes an interference avoiding facet, at least formed in either the elastic piece or the holding groove piece so that the interference avoiding facets avoid interference between adjacent multiple elastic pieces and/or between holding groove pieces.

12. The substrate storage container according to claim 2, wherein, of the two opposing surfaces of the elastic piece that oppose other elastic pieces, one of the opposing surfaces is formed with a depressed portion while the other opposing surface is formed with a projected portion, and
the depressed portion and projected portion are, at least, partially inclined forming interference avoiding facets, so that a plurality of adjacent elastic pieces are positioned using the depressed portions and projected portions.

13. The substrate storage container according to claim 3, wherein, of the two opposing surfaces of the elastic piece that oppose other elastic pieces, one of the opposing surfaces is formed with a depressed portion while the other opposing surface is formed with a projected portion, and
the depressed portion and projected portion are, at least, partially inclined forming interference avoiding facets, so that a plurality of adjacent elastic pieces are positioned using the depressed portions and projected portions.

14. The substrate storage container according to claim 4, wherein, of the two opposing surfaces of the elastic piece that oppose other elastic pieces, one of the opposing surfaces is formed with a depressed portion while the other opposing surface is formed with a projected portion, and
the depressed portion and projected portion are, at least, partially inclined forming interference avoiding facets, so that a plurality of adjacent elastic pieces are positioned using the depressed portions and projected portions.

15. The substrate storage container according to claim 2, wherein, of the two opposing surfaces of the holding groove piece that oppose other holding groove pieces, one of the opposing surfaces is formed with a depressed portion while the other opposing surface is formed with a projected portion, and
the depressed portion and projected portion are, at least, partially inclined forming interference avoiding facets, so that a plurality of adjacent holding groove pieces are positioned using the depressed portions and projected portions.

16. The substrate storage container according to claim 3, wherein, of the two opposing surfaces of the holding groove piece that oppose other holding groove pieces, one of the opposing surfaces is formed with a depressed portion while the other opposing surface is formed with a projected portion, and
the depressed portion and projected portion are, at least, partially inclined forming interference avoiding facets, so that a plurality of adjacent holding groove pieces are positioned using the depressed portions and projected portions.

17. The substrate storage container according to claim 4, wherein, of the two opposing surfaces of the holding groove piece that oppose other holding groove pieces, one of the opposing surfaces is formed with a depressed portion while the other opposing surface is formed with a projected portion, and
the depressed portion and projected portion are, at least, partially inclined forming interference avoiding facets, so that a plurality of adjacent holding groove pieces are positioned using the depressed portions and projected portions.

18. The substrate storage container according to claim 5, wherein the interference avoiding facet is inclined with an obtuse angle of 110° to 175°.

19. The substrate storage container according to claim 6, wherein the interference avoiding facet is inclined with an obtuse angle of 110° to 175°.

* * * * *